United States Patent [19]
Frohardt

[11] Patent Number: 6,089,167
[45] Date of Patent: Jul. 18, 2000

[54] ELECTROSTATIC DISCHARGE SAFE WORK STATION

[75] Inventor: Marcus S. Frohardt, Boise, Id.

[73] Assignee: Micron Electronics, Inc., Boise, Id.

[21] Appl. No.: 08/972,628

[22] Filed: Nov. 18, 1997

[51] Int. Cl.[7] .................................................. A47B 57/00
[52] U.S. Cl. ............................................ 108/94; 108/142
[58] Field of Search ................................ 108/20, 94, 139, 108/142, 161

[56] References Cited

U.S. PATENT DOCUMENTS

| | | | |
|---|---|---|---|
| 4,043,276 | 8/1977 | Dahl | .......................................... 108/28 |
| 5,559,051 | 9/1996 | Voldman et al. . | |
| 5,644,494 | 7/1997 | Richardson et al. . | |
| 5,676,360 | 10/1997 | Boucer et al. . | |

FOREIGN PATENT DOCUMENTS

| | | | |
|---|---|---|---|
| 3903351 | 8/1990 | Germany | .................................. 108/91 |
| 1905 | 1/1908 | United Kingdom | ................... 108/139 |
| 585622 | 2/1947 | United Kingdom | ................... 108/139 |

OTHER PUBLICATIONS

Boston Technical Furniture, *Product Catalog*, CAT003, pp. 9, 11 and 13.

Boston Technical Furniture, *Workstation Applications Handbook*, APP006, Fifth Edition, 1997, pp. 1–3, 16–18, 23–24, 59–60, and 73.

*Primary Examiner*—Peter M. Cuomo
*Assistant Examiner*—Gerald A. Anderson
*Attorney, Agent, or Firm*—Knobbe, Martens Olson & Bear, LLP

[57] ABSTRACT

A work station for assembling equipment comprises a rotatable work surface, a fixed work surface and a support frame. The rotatable work surface is rotatably mounted to the fixed work surface which is, in turn, mounted to the support frame. The work station includes a locking mechanism positioned between the rotatable work surface and the fixed work surface for adjusting the rotational orientation of the rotatable work surface. The rotatable work surface and the fixed work surface are both made of an electrostatic discharge (ESD) safe material.

40 Claims, 8 Drawing Sheets

ELECTROSTATIC DISCHARGE SAFE WORK STATION

RELATED APPLICATIONS

The subject matter of U.S. patent application entitled "METHOD OF ASSEMBLING COMPONENTS ON AN ELECTROSTATIC DISCHARGE SAFE WORK STATION," filed on Nov. 18, 1997, application Ser. No. 08/972,632, still pending and having attorney Docket No. MPATENT.049A is related to this application.

BACKGROUND OF THE INVENTION

1. Field of the Invention

The invention generally relates to work station design and fabrication and, more particularly, to rotating work stations.

2. Description of the Related Art

In today's competitive global industrial environment only companies that maintain the highest productivity and quality standards will prosper. Frequently, companies are able to automate tasks to improve productivity and quality of the end products.

This is especially true for computer manufacturing industries where a majority of the tasks are performed by assembly machines. For example, chips carrying high density integrated circuits are often mounted on circuit boards by assembly-line machines. Using such assembly-line machines advantageously enables product designs that improve productivity and quality. However, in such industries, an end product such as a fully assembled computer cannot be entirely manufactured without human intervention. In fact, often many repetitive and difficult tasks can only be performed by human operators. Such tasks may include assembling various parts of a computer, fastening them, testing them and the like. It should be noted that these tasks require repetitive lifting, lowering and reaching motions which often cause muscular, skeletal stresses in the operator's body. Such problems, however, can be avoided by designing workstations which can give operators easy and comfortable access to their equipment and to the tasks that they perform. The implementation of such operator-friendly workstations in the work place may realistically improve productivity as well as reduce above-mentioned work related discomfort.

Similarly, the nature of the task being performed and the size of objects used in the task also play an important role in design and implementation of workstations. The workstation should be properly designed to accommodate the weight, size and the characteristics of the product on which the task is being performed.

For instance, in the computer industry, workstations should be equipped with suitable electrical grounding to ground electrostatic discharge (ESD) so that the fine circuits on the sensitive electronic parts can be shielded from the harmful effects of static-electricity. Additionally, if the assembling task involves heavy or cumbersome objects, such as computer servers used in internet technologies, the design of efficient working areas having proper safety features is often the most challenging part of the work station design. Such servers, for example, may weigh up to 200 lbs which makes them quite cumbersome to handle on a workstation during an assembly process. This is particularly true when the worker has to repeatedly move multiple objects of such weight.

In the computer industry, in order to overcome these problems, workstations having a metal work surface and a metal frame are often used. Such work stations are able to support heavy objects with their metallic, usually steel, construction. However, such workstations are not operator friendly. Operators typically have to put a great deal of effort in to handle the object or to move the object over the work surface. Further, operators often cannot comfortably reach all the tools and the parts as well as the object, from their fixed location. As an object being assembled becomes larger and heavier, operators are forced to reach further, until eventually they have to take steps around the work station to reach locations on the far ends of the object. Unfortunately, this inconvenient situation reduces the efficiency of the operator, and requires more individual work space around the workstation to gain access to these hard to reach places. Of course, this also increases the cost of the assembling system and its operation. Further, such metallic workstations need to be safely grounded to prevent static electricity problems. This requires proper grounding hardware and associated grounding connections, which further add to the production costs.

Thus, in the computer industry, there is a need to develop new ESD safe work stations which are capable of providing operators easy and comfortable access to their equipment while performing the necessary task. To this end there is a need for a workstation which provides grounding for ESD purposes and is easily adjustable to facilitate assembly of the object under construction.

SUMMARY OF THE INVENTION

The aforementioned needs are satisfied by the apparatus of the invention. In one embodiment of the invention, a workstation for assembling devices is provided. The workstation includes a rotatable work surface, a fixed work surface, a support member and a stop mechanism. The rotatable work surface is made of an electrostatic discharge (ESD) safe material and defines an axis that is perpendicular to the plane of the work surface. The fixed work surface is made of an electrostatic discharge safe material. Further, the rotatable work surface is connected to the fixed work surface so as to be rotatable about the axis. The support member is connected to the fixed work surface so that a continuous path to ground is provided between the frame and the rotatable work surface through the fixed work surface. The stop mechanism interconnects the rotatable work surface and the fixed work surface so as to secure the rotatable work surface in one of a plurality of rotational orientations about the axis.

In another embodiment of the invention the rotatable work surface includes a support member, a first work surface, a rotatable joint member, a second work surface and a locking mechanism. The first work surface is mounted to the support member. The rotatable joint member is connected to the first work surface. The second work surface is coupled to the rotatable joint member so as to permit rotation of the second work surface with respect to the first work surface. The locking mechanism is mounted to said first surface for selectively locking the second work surface in position relative to the first work surface.

The aforementioned advantages of the invention will become more fully apparent from the following description taken in conjunction with the accompanying drawings.

DETAILED DESCRIPTION OF THE INVENTION

Figure 1A:
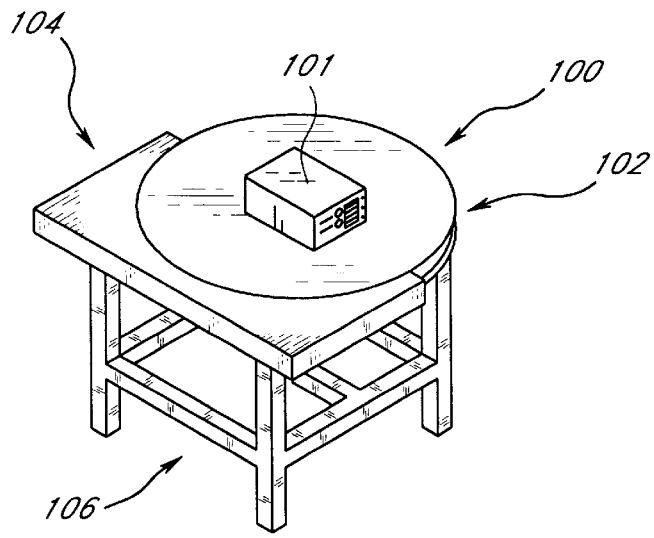
FIG. 1A is a perspective view of an embodiment of the workstation of the invention.
Figure 1B:
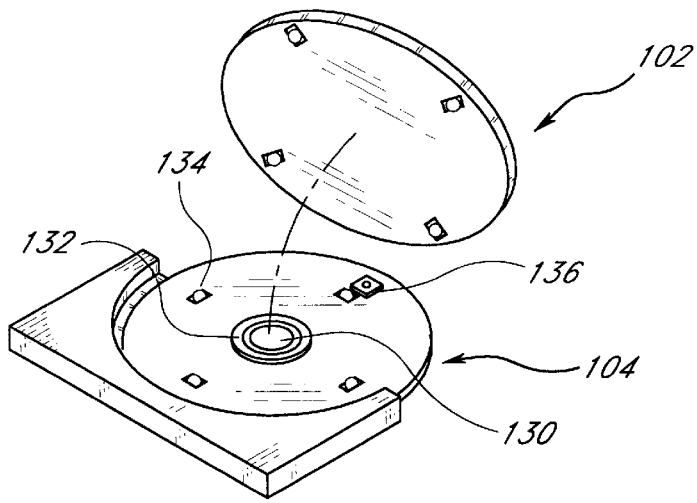
FIG. 1B is an exploded perspective view of the work station shown in FIG. 1A.
Figure 2A:
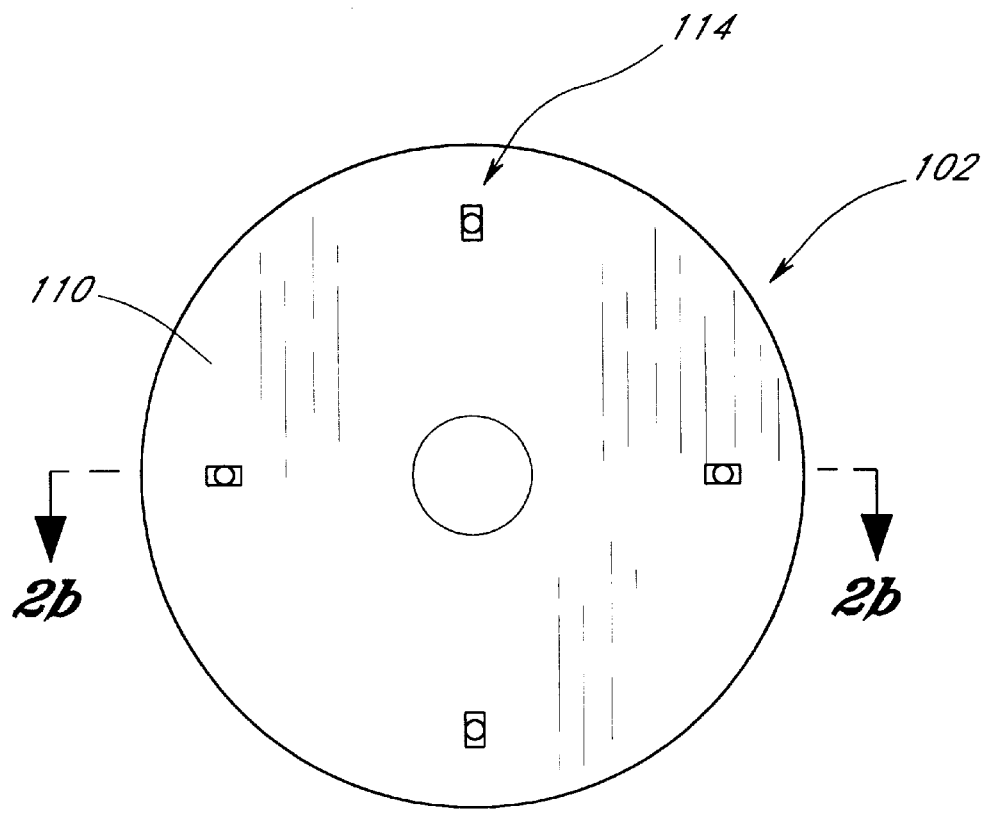
FIG. 2A is a bottom plan view of the rotatable work member of the work station shown in FIG. 1A.

Reference will now be made to the drawings wherein like numerals refer to like parts throughout. FIGS. 1A–1B illustrate one embodiment of a workstation 100 for assembling electronic devices. The workstation 100 comprises a first member 102, a second member 104 and a base member 106. In use, a task object 101, such as a computer to be assembled may be placed on the first member 102 of the work station 100. In one embodiment, the first member 102 is movably secured onto the second member 104 which is further secured on top of the base member 106. As illustrated in FIG. 2A, the first member 102 is a movable work-member, such as a rotatable work-member having a circular disk shape which is rotatable about a z-axis that is perpendicular to the plane of the top surface 108 of the rotatable member 102.

Figure 2B:
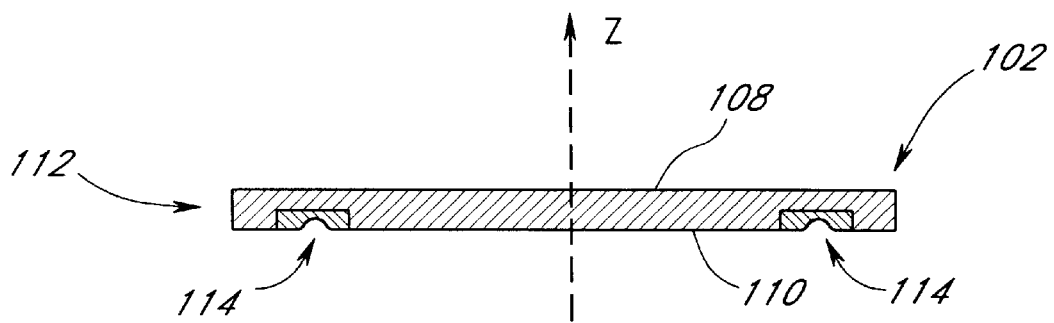
FIG. 2B is a cross-sectional view of the rotatable work member, taken along line 2B of FIG. 2A.

As is shown in FIGS. 2A and 2B, the rotatable-member 102 comprises a top surface 108, a bottom surface 110 and an edge wall 112 which is peripherally perpendicular to both surfaces 108 and 110. The top surface 108 of the rotatable member 102 is comprised of a substantially flat surface and will be referred to hereafter as rotatable work surface. As shown in FIG. 2A, the bottom surface 110 of the rotatable member 102 may include a plurality of locking apertures 114, which will be described in more detail hereafter with reference to FIGS. 3A–3B.

In one embodiment, the bottom surface 110 includes four locking apertures 114 aligned evenly radially around the bottom surface 110 at 90 degree intervals relative to one another.

Figure 3A:
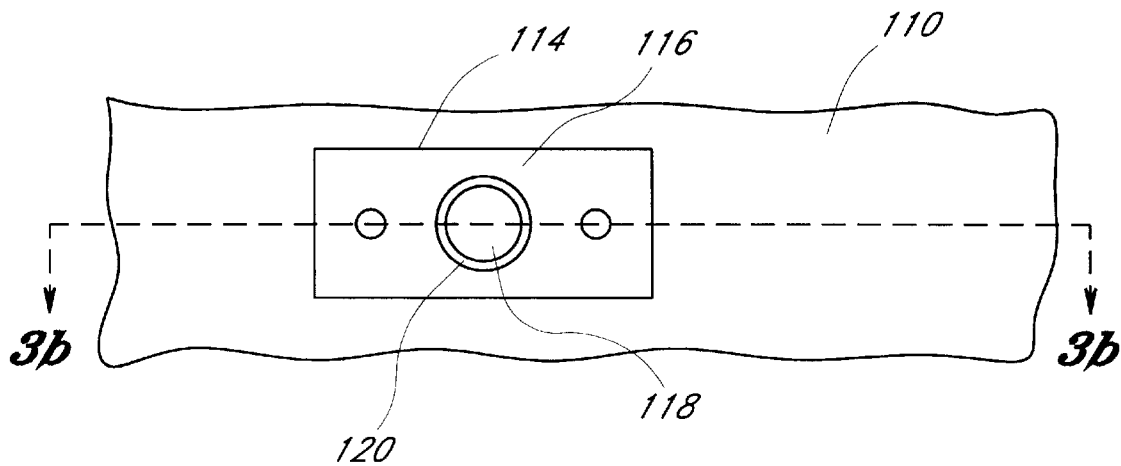
FIG. 3A is a plan view of a locking aperture wherein the locking aperture is positioned on the bottom surface of the rotatable work member.
Figure 3B:
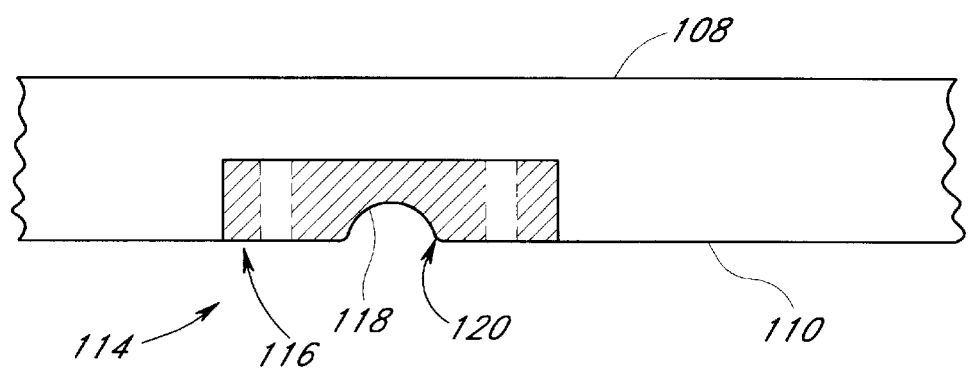
FIG. 3B is a cross sectional view of the locking aperture taken along line 3B of FIG. 3A.

As shown in FIG. 3A, the locking aperture 114 of this embodiment may be formed from a rectangular plate having first surface 116 and a hemispherical depression 118 formed on the first surface 116 of locking aperture 114. As shown in FIGS. 3A–3B, the locking apertures 114 may be affixed to the bottom surface 110 of the rotatable work member 102 by any known means such as screws, and in the manner shown in FIGS. 3A–3B. The locking apertures 114 may be made of a durable material such as brass or the like.

Figure 5A:
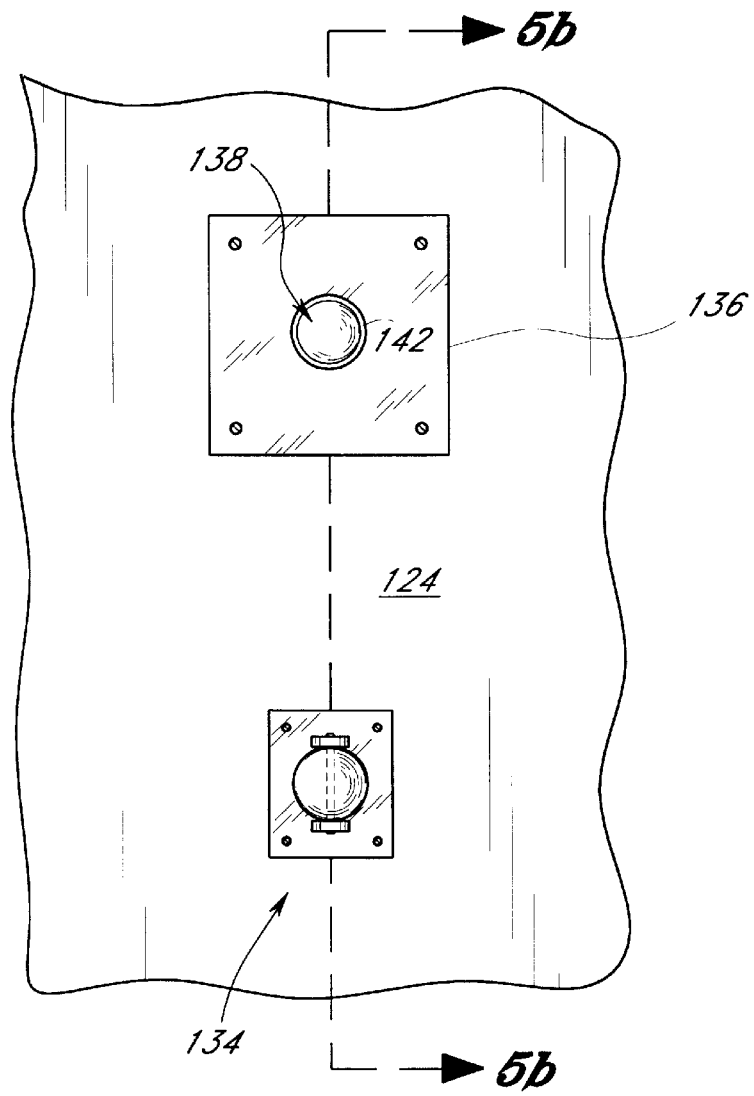
FIG. 5A is a top plan view of a portion of the fixed work member wherein a locking pin assembly and a roller are positioned on the portion of the fixed work member.
Figure 5B:
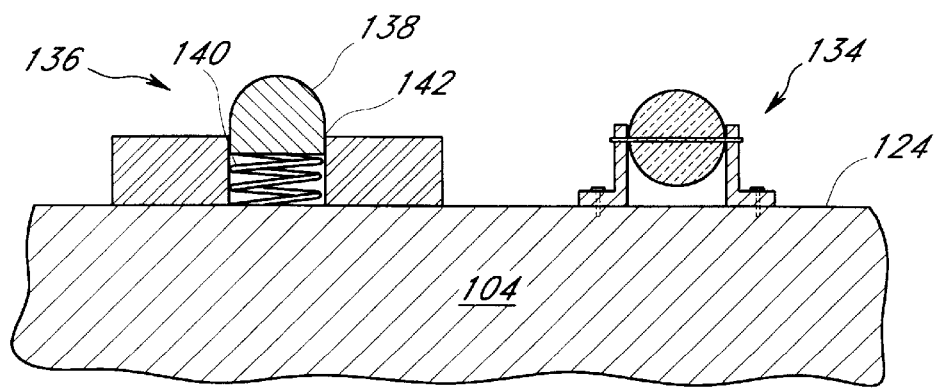
FIG. 5B is a cross sectional view of the portion of the fixed work member taken along the line 5B of FIG. 5A.

As will be explained more fully hereinbelow, the hemispherical depression 118 in the locking aperture 114 is adapted to receive a locking pin 136 positioned on the second member 104 (FIGS. 5A and 5B). Further, the circular base 120 of the hemispherical depression 116 is well rounded to facilitate the easy removal of the locking pin 138 when the rotatable work member 102 is rotated with respect to the fixed work member 106.

Figure 4A:
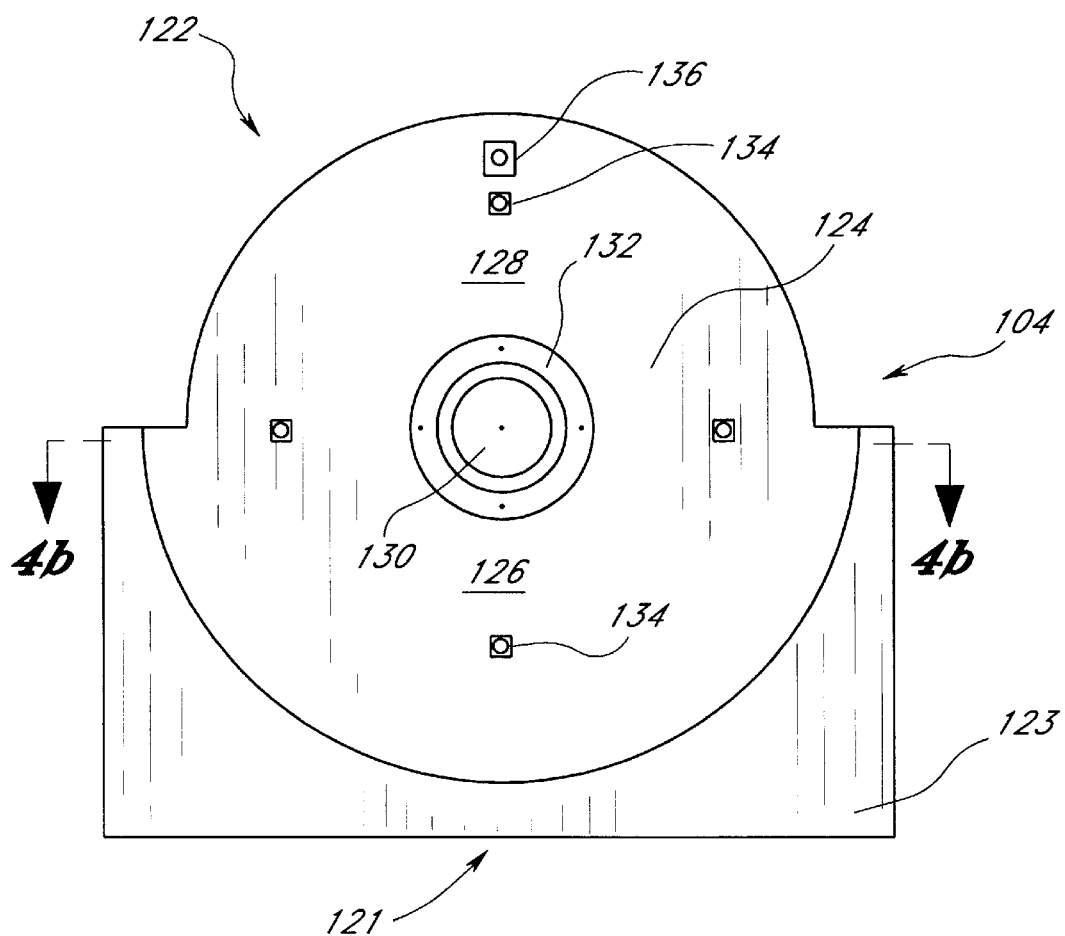
FIG. 4A is a top plan view of the fixed work member of the work station shown in FIG. 1A.

As illustrated in FIG. 4A, in this embodiment, the second member 104 is a fixed work-member having a rectangular end 121 and a semicircular end 122. The fixed work member 104 further comprises a fixed work surface 123 and a recessed surface 124. The recessed surface 124 is comprised of an area defined by a first and a second semicircles 126 and 128. In this embodiment, the semicircular areas 126 and 128 have the same center and disposed symmetrically around the z-axis which is perpendicular to the plane of the recessed surface 124.

A semicircular wall 130 rises perpendicularly out plane of the recessed area 124 along the arc of the first semicircular area 126 and terminates in the plane of the fixed work surface 123. In this embodiment, the first semicircular area 126 has a radius-R which is slightly larger than the radius of the rotatable member 102, for example 1–2 mils larger than the radius of the rotatable member 102. However, the second semicircular area 128 has a radius-r which is substantially smaller than the radius of the rotatable work member 102 such as in the range of 1–2 inches. As will be further explained hereinbelow, when the rotatable work member 102 and the fixed work member 104 are assembled together, the larger radius of the rotatable work member 102 provides a grip region 125 (see FIG. 7) for the operator to manually grasp and rotate the rotatable work member 102 along the semicircular arc of the second area 128.

In this embodiment, the rotatable work member 102 and the fixed work member 104 can be assembled using several component parts that provide support and motion for the rotatable work member 102. In particular, the support and the motion for the rotatable work member 102 may be provided by a central swivel assembly 132 and a number of rollers 134. The swivel assembly 132 may be constructed in the manner of a conventional lazy susan, wherein the swivel ability is provided by metallic ball bearings and parts. The central swivel assembly 132 is affixed centrally to the fixed work member 104 and is oriented radially from the center 130 of the semicircular areas 126 and 128, in the manner shown in FIGS. 4A–4B. The rotatable work member 102 is attached in a well known manner to the swivel assembly 132 so that the rotatable member 102 can rotate about the z-axis. When assembled, the swivel assembly 132 provides a central support as well as rotational motion about the z-axis for the rotatable work member 102.

Figure 4B:
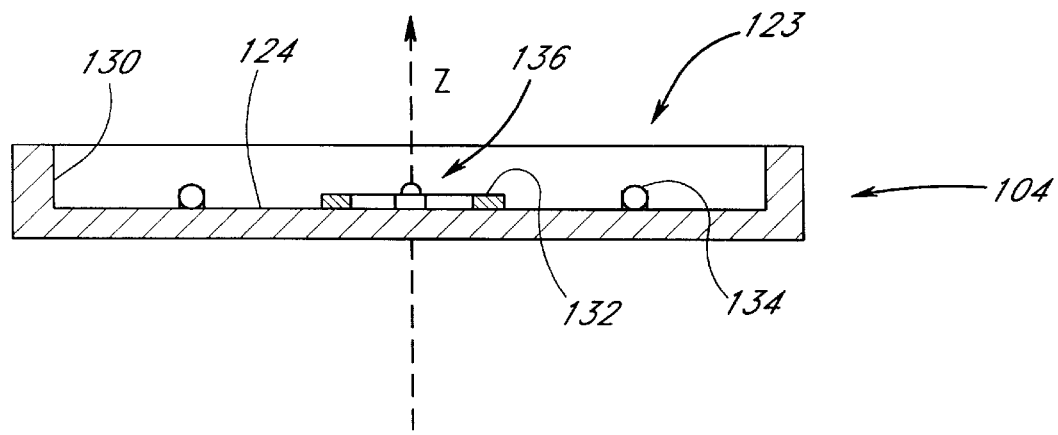
FIG. 4B is a cross-sectional view of the fixed work member taken along line 4B of FIG. 4A.

In one embodiment, four rollers 134 are permanently attached to the recessed surface 124 of the fixed work member 104 and are aligned evenly radially about the center 130 at 90 degree intervals relative to one another, in the manner shown in FIGS. 4A–4B. As shown in FIG. 5, in one embodiment, conventional ball (bead) rollers 134 may be used to provide motion and support for the rotatable work member 102. The ball rollers 134 can be secured to the fixed work member 104 by screws or the like as in the manner shown in FIGS. 4A–5B. In particular, the height of the swivel assembly 132 and the height of the rollers 134 should be sufficiently high so that when the rotatable work member 102 is assembled with the fixed work member 104, the fixed work surface 123 of the fixed work member 104 is in the same plane as the rotatable work surface 108 of the rotatable work member 102.

As illustrated in FIGS. 1B, 5A and 5B (also see FIGS. 8A–8B), a locking pin assembly 136 is attached to the recessed surface 124 of the work member 104 and radially aligned to receive the locking apertures 120 formed in the bottom surface 110 of the rotatable member 102 when the rotating work member 102 is mounted on the fixed work member 104. As shown in FIG. 5B the locking pin assembly 136 may be comprised of a locking pin 138, a spring 140 coupled to the pin 138 and a pin housing 142. The locking pin 138 of the locking pin assembly 136 has a hemispherical tip which is preferably slightly smaller than the hemispherical depression 118 of the locking aperture 114 of the rotatable work member 102 (see FIGS. 3A–3B). As shown in FIG. 1B the locking pin assembly 136 may be affixed close to the outer edge 122 of the recessed surface 124 of the fixed work member 102.

Figure 6:
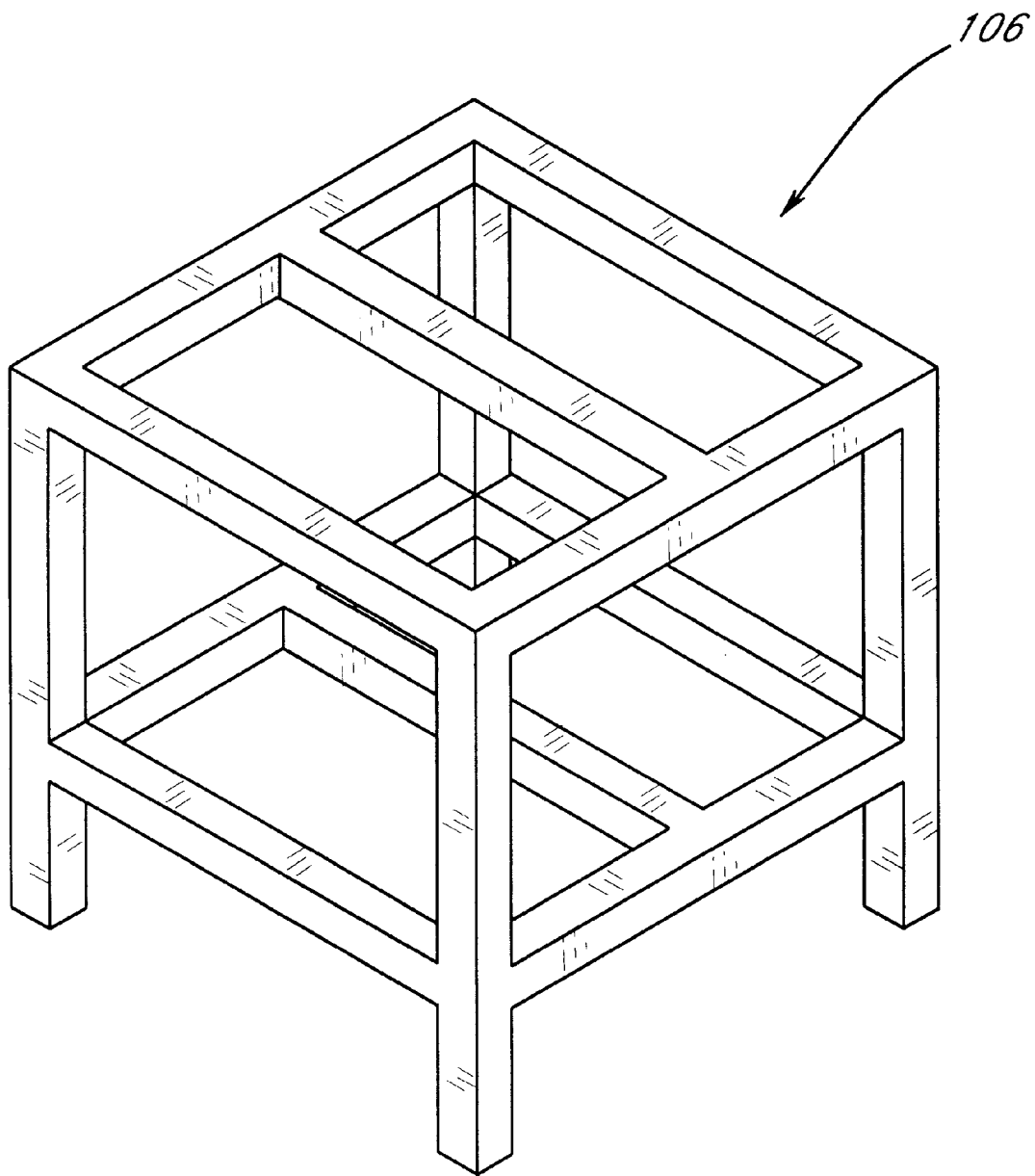
FIG. 6 is a perspective view of the support frame of the work station shown in FIG. 1A.

The fixed work member 104 is mounted on the base member 106 with appropriate means, such as bolts. Referring to FIG. 6 the base member 106 comprises a support stand which is constructed of steel tubing in the manner shown in FIG. 6. The base member 106 is sized and designed to fit underneath the fixed work member 104 and to withstand excessive loads occurring during the usage of the work station 100.

Figure 7:
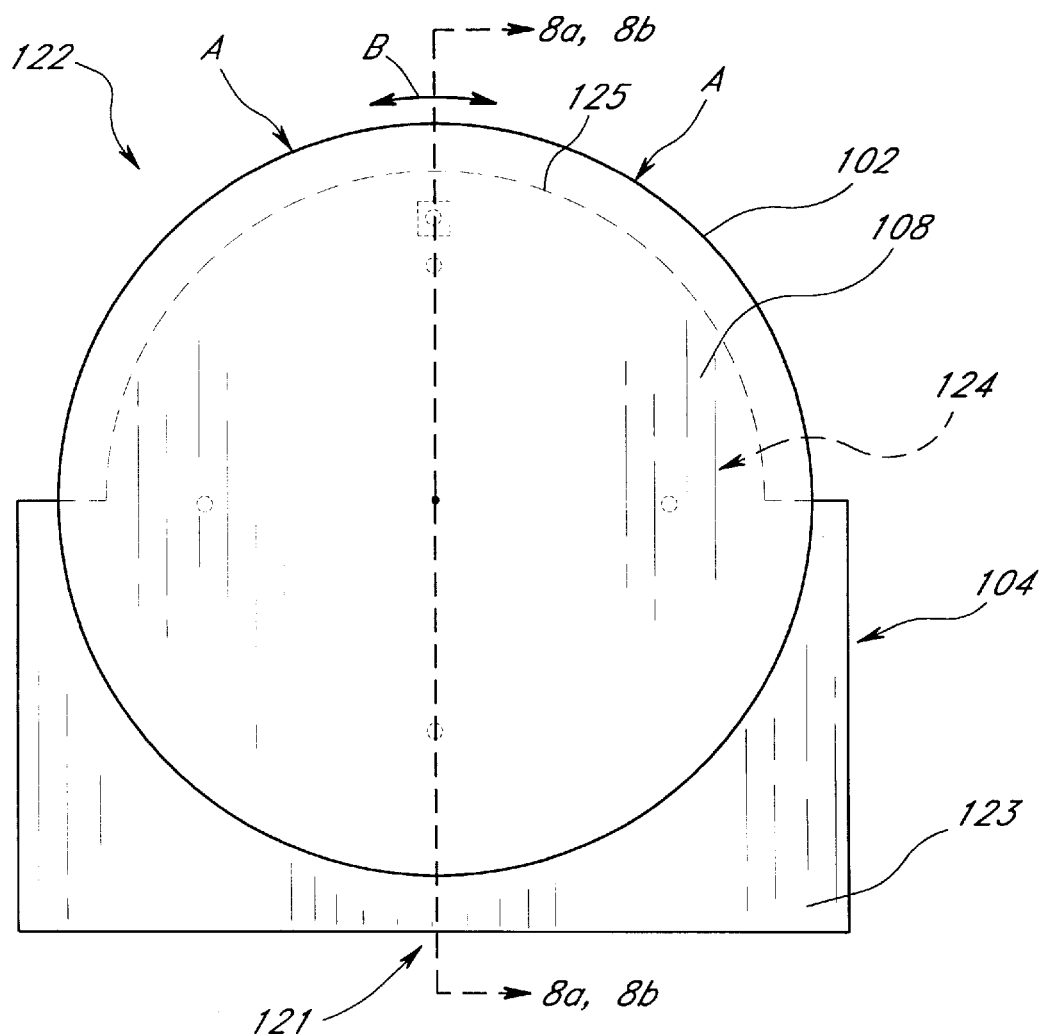
FIG. 7 is a top plan view of the work station shown in FIG. 1A.

As illustrated in FIG. 7, once the fixed work member 104 is secured over the base member 106, the rotatable work member 102 is mounted on the fixed work member 104, and specifically, onto the recessed surface 124, centered about z-axis. As explained above, the rotatable work member 102 is secured to the swivel assembly 132 by bolts or by other means and supported by both rollers 134 and the swivel assembly 132.

Figure 1B:
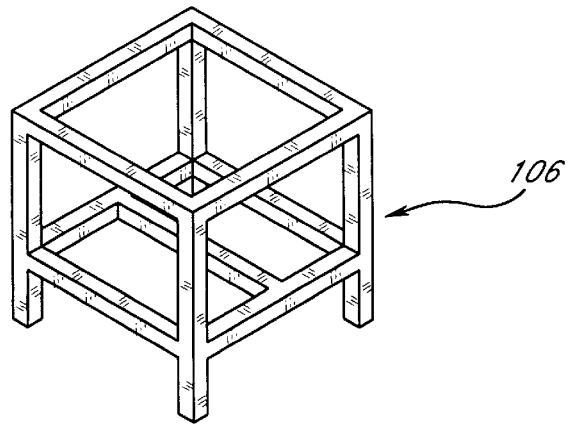

During the use of the work station 100, the rotatable work member 102 is rotated manually with respect to the fixed work member 104. The rotational motion can advantageously be applied by grasping the edge of the rotatable work member 102 at the grip locations indicated by arrows 'A' (FIG. 1), and rotating the rotatable work member 102 in either direction, as depicted by two headed arrow 'B', with respect to the fixed work member 104. A locking mechanism, provided by the locking pin assembly 136 and the locking apertures 114, allows the rotatable work member 102 to be fixed in various rotational intervals.

Figure 8A:
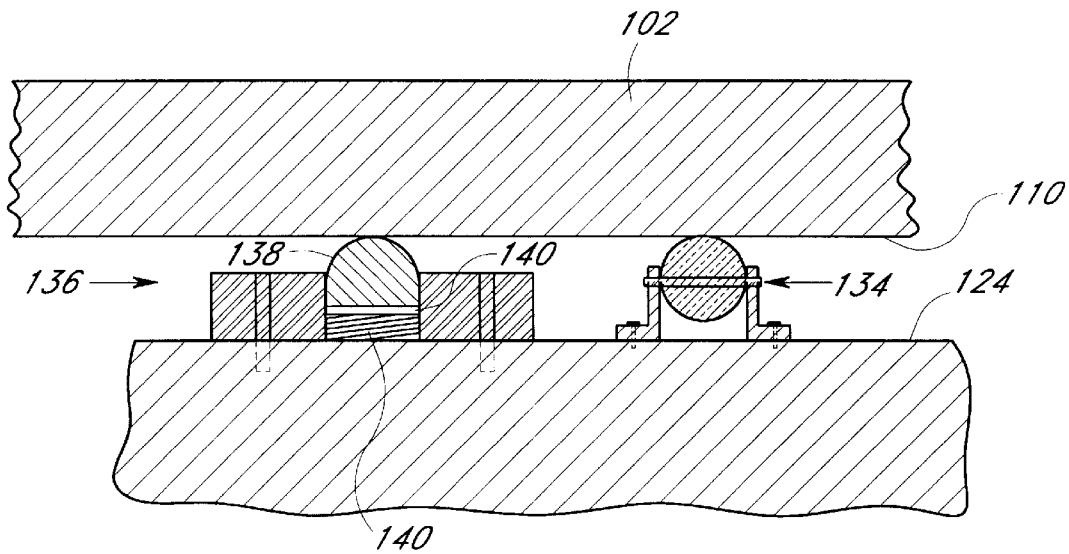
FIGS. 8A–8B are cross sectional views of the locking mechanism taken along the line 8A, 8B of FIG. 7.
Figure 8B:
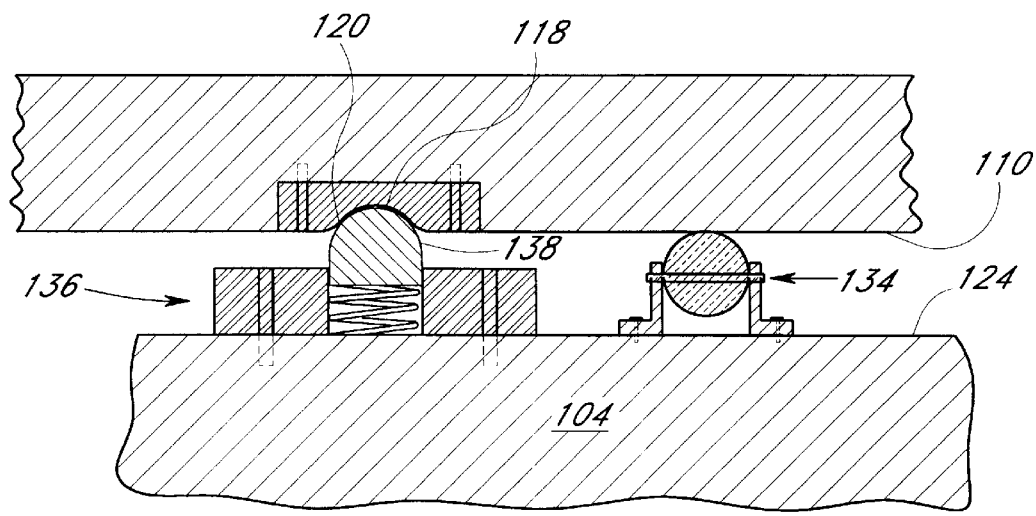

Specifically, in the embodiment illustrated in FIGS. 8A–8B, the locking pin 138 locks the rotatable work member 102 at 90 degree intervals. Referring to FIG. 8A, it is seen that as the rotatable work member 102 is being rotated, the spring 140 underneath the hemispherical tip of the locking pin 138 is fully retracted into the pin housing 142. At this position the hemispherical tip of the locking pin 138 supports the bottom 110 of the rotatable work member 104 along side the rollers 134 and the swivel assembly 132. As illustrated in FIG. 6B, as the hemispherical tip of the locking pin 138 of the pin assembly 136 slides into one of the hemispherical depressions 118, the spring 140 is unloaded and forces the tip 138 into the depression 118, thereby locking the rotatable work member 102 in one of the 90 degree interval location. Similarly, in order to free the locking pin 138 from the depression 118, the rotatable work member 102 is rotated. This rotational motion removes the locking pin 138 from the depression 118 by smoothly sliding the locking pin 138 out of the depression 118. At this point, it will be understood that the fit between the hemispherical depression 118 and the hemispherical tip of the locking pin 138 should be sufficiently loose so as to facilitate the easy removal of the locking pin 138 from the depression 118, but sufficiently tight so as to prevent unnecessary wobble of the rotatable work member 102. Combined with the rotatable work surface feature, the locking mechanism provides a convenient and safe work environment for the operator using the work station 100. As opposed to prior art work benches, this embodiment allows the operator to work on various locations of the task object without needing to handle the task object or to move about the object. It will be appreciated that such features provide a fast and efficient work environment, especially, when one is working on heavy electronic equipment.

One desireable feature of this embodiment is the fact that the rotatable work member 102 and the fixed work member 104 are made of electrostatic discharge (ESD) safe materials. One exemplary ESD material is carbon fiber impregnated polymeric composite material having a conductivity range of 7–10 coulomb/square inch, although any of numerous alternative material could be used. Such materials conveniently dissipate static electricity during the handling and assembly of static electricity sensitive electronic components. During the course of such work, the static electricity occurring over the rotatable work surface 108 is dissipated through the material and transferred to the metallic base member through the swivel assembly 132 and the fixed work member 104. As mentioned earlier in the background section, the prior art work benches use metal work surfaces which are not ESD safe, thereby requiring grounding circuitry.

Hence, although the foregoing description of the invention has shown, described and pointed out novel features of the invention, it will be understood that various omissions, substitutions, and changes in the form of the detail of the apparatus and method as illustrated as well as the uses thereof, may be made by those skilled in the art, without departing from the spirit of the invention. Consequently, the scope of the invention should not be limited to the foregoing discussions, but should be defined by the appended claims.

What is claimed is:

1. A workstation for assembling devices comprising:
   a rotatable work surface comprising an electrostatic discharge (ESD) safe material wherein said work surface defines an axis that is perpendicular to the plane of the work surface;
   a fixed work surface comprising an electrostatic discharge (ESD) safe material wherein said rotatable work surface is connected to said fixed work surface so as to be rotatable about the axis;
   a support member connected to said fixed work surface so that a continuous path to ground is provided between the support member and said rotatable work surface through said fixed work surface; and
   a stop mechanism interconnecting said rotatable work surface and said fixed work surface so as to secure said rotatable work surface in one of a plurality of rotational orientations about said axis.

2. The workstation of claim 1, wherein said fixed work surface comprises a recessed surface.

3. The workstation of claim 2, wherein a rotatable joint member is mounted to said recessed surface.

4. The workstation of claim 3, wherein said rotatable joint member is a swivel joint.

5. The workstation of claim 4, wherein said swivel joint is coupled to said rotatable work surface so as to permit rotation of said rotatable work surface with respect to said fixed work surface.

6. The workstation of claim 5, wherein said swivel joint supports said rotatable work surface.

7. The workstation of claim 1, wherein said electrostatic discharge safe material is carbon fiber impregnated polymer material.

8. The workstation of claim 7, wherein said electrostatic discharge safe material has a conductivity range of 7–10 coulomb/square inch.

9. The workstation of claim 2, wherein said stop mechanism comprises a retractable pin that is disposed over said recessed surface for engaging with one of a plurality of equally radially spaced aperture members disposed beneath said rotatable work surface.

10. The workstation of claim 9, wherein said aperture members comprise hemispherical depressions to receive said retractable pin.

11. The work station of claim 10, wherein said aperture member is made of brass.

12. The workstation of claim 9, wherein said depressions are disposed at 90 degree intervals.

13. The workstation of claim 9, wherein a spring member biases said retractable pin into engagement with said depressions beneath said work surface.

14. The workstation of claim 13, wherein said retractable pin is withdrawn from said depressions by rotational movement of said rotatable work surface.

15. The workstation of claim 1, wherein said rotatable work surface is supported by roller members being disposed radially on said recessed surface.

16. The workstation of claim 15, wherein said roller members are disposed radially on said recessed surface at 90 degree intervals.

17. A workstation for assembling devices comprising:
- a rotatable work surface comprising an electro static discharge safe material wherein said work surface defines an axis that is perpendicular to the plane of the work surface;
- a fixed work surface comprising an electrostatic discharge safe material wherein said rotatable work surface is connected to said fixed work surface so as to be rotatable about the axis; and
- a frame connected to said fixed work surface so that a continuous electrical path to ground is provided between the frame and said rotatable work surface through said fixed work surface.

18. The workstation of claim 17, wherein said fixed work surface comprises a recessed surface.

19. The workstation of claim 18, further comprising a rotatable joint member that is mounted to said recessed surface.

20. The workstation of claim 19, wherein said rotatable joint member is a swivel joint.

21. The workstation of claim 20, wherein said swivel joint is coupled to said rotatable work surface so as to permit rotation of said rotatable work surface with respect to said fixed work surface.

22. The workstation of claim 21, wherein said swivel joint supports said rotatable work surface.

23. The workstation of claim 17, wherein said electrostatic discharge safe material is carbon fiber impregnated polymer material.

24. The workstation of claim 23, wherein said electrostatic discharge safe material has a conductivity range of 7–10 coulomb/square inch.

25. The workstation of claim 17, wherein said rotatable work surface is supported by roller members being disposed radially on said recessed surface.

26. The workstation of claim 25, wherein said roller members are disposed radially on said recessed surface at 90 degree intervals.

27. A rotatable work surface comprising:
- a support member;
- a first work surface mounted to said support member;
- a rotatable joint member mounted to said first work surface;
- a second work surface coupled to said rotatable joint member so as to permit rotation of said second work surface with respect to said first work surface; and
- a locking mechanism which selectively locks said second work surface in position relative to said first work surface.

28. The workstation of claim 27, wherein said first work surface and said second work surface are made of an electrostatic discharge safe material.

29. The workstation of claim 28, wherein said electrostatic discharge safe material is carbon fiber impregnated polymer material.

30. The workstation of claim 29, wherein said electrostatic discharge safe material has a conductivity range of 7–10 coulomb/square inch.

31. The workstation of claim 27, wherein said rotatable joint member is a swivel joint.

32. The workstation of claim 31, wherein said swivel joint supports said rotatable work surface.

33. The workstation of claim 27, wherein said locking mechanism comprises a retractable pin disposed over said first work surface for engaging with one of a plurality of equally radially spaced aperture members disposed beneath said second work surface.

34. The workstation of claim 33, wherein said aperture members are disposed at 90 degree intervals.

35. The workstation of claim 33, wherein said aperture members comprise hemispherical depressions to receive said retractable pin.

36. The work station of claim 35, wherein said aperture member is made of brass.

37. The workstation of claim 33, wherein a spring member biases said retractable pin into engagement with said depressions on said aperture members beneath said second work surface.

38. The workstation of claim 37, wherein said retractable pin is withdrawn from said depressions by rotational movement of said second work surface.

39. The workstation of claim 27, wherein said second work surface is supported by roller members being disposed radially on said recessed surface.

40. The workstation of claim 39, wherein said roller members are disposed radially on said second work surface at 90 degree intervals.

* * * * *